(12) United States Patent
Lu et al.

(10) Patent No.: US 9,780,763 B1
(45) Date of Patent: Oct. 3, 2017

(54) METHOD AND APPARATUS FOR OFFSET CALIBRATION OF A MULTI-MODE HIGH-SPEED COMPARATOR

(71) Applicant: Marvell International Ltd., Hamilton (BM)

(72) Inventors: Wei Lu, Saratoga, CA (US); Xiangzhu Xu, Chengdu (CN); Ke Xiao, Chengdu (CN)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/259,167

(22) Filed: Sep. 8, 2016

Related U.S. Application Data

(60) Provisional application No. 62/216,462, filed on Sep. 10, 2015.

(51) Int. Cl.
| | |
|---|---|
| *G01R 35/00* | (2006.01) |
| *H03K 3/356* | (2006.01) |
| *H02M 3/156* | (2006.01) |
| *H02M 1/08* | (2006.01) |
| *H02M 1/00* | (2006.01) |

(52) U.S. Cl.
CPC ........ *H03K 3/356104* (2013.01); *H02M 1/08* (2013.01); *H02M 3/156* (2013.01); *H02M 2001/0009* (2013.01)

(58) Field of Classification Search
CPC ... G01R 35/00; G01R 35/005; H03M 1/1009; H03M 1/1023; G11C 2207/2254
See application file for complete search history.

(56) References Cited

U.S. PATENT DOCUMENTS

| | | | | |
|---|---|---|---|---|
| 6,507,241 B1* | 1/2003 | Ritter | .................. | H03F 3/45941 327/307 |
| 7,352,307 B2* | 4/2008 | Iorgulescu | .......... | H03M 1/1019 327/307 |
| 7,944,286 B2* | 5/2011 | Yoo | ........................ | H03J 1/0008 327/513 |

(Continued)

OTHER PUBLICATIONS

Bodo's Power Systems; "Hysteretic control Performance with no Output Ripple? Smooth!"; www.powerguru.org/hysteretic-control-performance-with-no-output-ripple-smooth/; May 1, 2008; 6 pages.

*Primary Examiner* — Gary L Laxton

(57) ABSTRACT

A calibration circuit including mode, bias, calibration, offset, resistance and code modules. The mode module selects operation in a first or second mode. The bias module generates, for the preamplifier, a first and second bias currents respectively while in first and second modes. The calibration module, during calibration of first mode, connects inputs of preamplifier together to receive a predetermined voltage. The offset module determines an offset based on output voltages of preamplifier or output voltage of comparator and generates a control signal based on whether the offset is within a predetermined range. The resistance module, based on control signal and during calibration of first mode, adjusts a resistance of a resistor in a first resistance set of preamplifier for the first mode. The code module generates a calibration code based on the resistance. The resistance module calculates a second resistance set for second mode based on the calibration code.

20 Claims, 5 Drawing Sheets

(56) References Cited

U.S. PATENT DOCUMENTS

| | | | | |
|---|---|---|---|---|
| 8,901,937 B2* | 12/2014 | Kosic | .................. | H03K 5/2445 |
| | | | | 324/601 |
| 2009/0278601 A1* | 11/2009 | Huang | ................ | H03F 3/45183 |
| | | | | 330/254 |

* cited by examiner

METHOD AND APPARATUS FOR OFFSET CALIBRATION OF A MULTI-MODE HIGH-SPEED COMPARATOR

CROSS-REFERENCE TO RELATED APPLICATIONS

This application claims the benefit of U.S. Provisional Application No. 62/216,462, filed on Sep. 10, 2015. The entire disclosures of the applications referenced above are incorporated herein by reference.

FIELD

The present disclosure relates to calibration of modes of a comparator.

BACKGROUND

Network devices, such as cellular phones, laptop computers, tablets, and wearable devices, include semiconductor components. Examples of the semiconductor components are power converters, analog-to-digital converters, and digital-to-analog converters. Each of the semiconductor components can include a comparator.

As an example, a power management converter can convert a received first direct current (DC) voltage (e.g., 5 volts (V)) to a second DC voltage (e.g., 1.2 V). The power management converter includes a comparator. The comparator receives and compares a first input voltage and a second input voltage to generate a control signal. The first input voltage is representative of the first DC voltage. The second input voltage is representative of the second DC voltage. The second DC voltage is fed back via a feedback loop to generate the second input voltage. The control signal controls a state of a transistor, which in turn sets the second DC voltage (or output voltage) of the power management converter.

The first DC voltage can be pulse-width-modulated (PWM) to generate a stable voltage (i.e. second DC voltage) after an inductor/capacitor (LC) filter network. The feedback loop senses the second DC voltage and compares the second DC voltage to a reference voltage (i.e. Vref) to generate a stable voltage Vcomp via a compensation network. The stable voltage Vcomp is then compared to a first DC voltage supply current information to generate a duty-cycled control signal $V_{CTRL}$ via the comparator. As a result, input signals of the comparator change at certain duty cycles and frequencies. The duty cycles and frequencies are based on (i) DC values of the first DC voltage and second DC voltage, (ii) the load current of the $2^{nd}$ voltage rail, and (iii) a speed at which an output of the comparator changes relative to changes in the input voltages. A comparator that is capable of responding quickly to changes in the input voltages or load current on output voltage may provide a highly-accurate voltage output.

SUMMARY

A calibration circuit is provided and includes a mode module, a bias module, a calibration module, an offset module, a resistance module and a code module. The mode module is to select operation in a first mode or a second mode. The bias module is to generate (i) a first bias current for a preamplifier of a comparator while in the first mode, and (ii) a second bias current for the preamplifier while in the second mode. The calibration module is to, during calibration of the first mode, (i) connect inputs of the preamplifier together to receive a predetermined voltage. The offset module is to (i) determine an offset based on (a) output voltages of the preamplifier, or (b) an output voltage of the comparator, and (ii) generate a control signal based on whether the offset is within a first predetermined range. The resistance module is to, based on the control signal and during calibration of the first mode, adjust a resistance of a resistor in a resistance set of the preamplifier for the first mode. The code module is to generate a calibration code based on the resistance. The resistance module is to, subsequent to calibrating the first mode, calculate a second resistance set for second mode based on the calibration code determined during the calibration of the first mode.

In other features, a calibration circuit is provided and includes a mode module, a bias module, an offset module, a resistance module and a code module. The mode module is to select operation in a first mode or a second mode. The bias module is to generate (i) a first bias current for a preamplifier of a comparator while in the first mode, and (ii) a second bias current for the preamplifier while in the second mode. The offset module is to, during calibration of the first mode, monitor an output voltage of the comparator, and (ii) generate a control signal based on the output voltage. The resistance module is to, based on the control signal and during calibration of the first mode, adjust a resistance of a resistor of the preamplifier for the first mode. The code module is to generate a calibration code based on the resistance. The resistance module is to, subsequent to calibrating the first mode, calibrate the second mode based on the calibration code in the first mode.

In other features, a method of calibrating a comparator circuit is provided and includes: selecting operation in a first mode or a second mode; generating (i) a first bias current for a preamplifier of a comparator while in the first mode, and (ii) a second bias current for the preamplifier while in the second mode; and during calibration of the first mode, (i) connecting inputs of the preamplifier together to receive a predetermined voltage, (ii) determining an input referred offset of the preamplifier based on (a) output voltages of the preamplifier, and (b) an output voltage of the comparator, and (iii) generating a control signal based on whether the offset is within a first predetermined range. The method further includes: based on the control signal and during calibration of the first mode, adjusting a resistance of a resistor in a first resistance set of the preamplifier for the first mode; generating a calibration code based on the first resistance; and subsequent to calibrating the first mode, calculating a second resistance set for second mode based on the calibration code determined during the calibration of the first mode.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1:
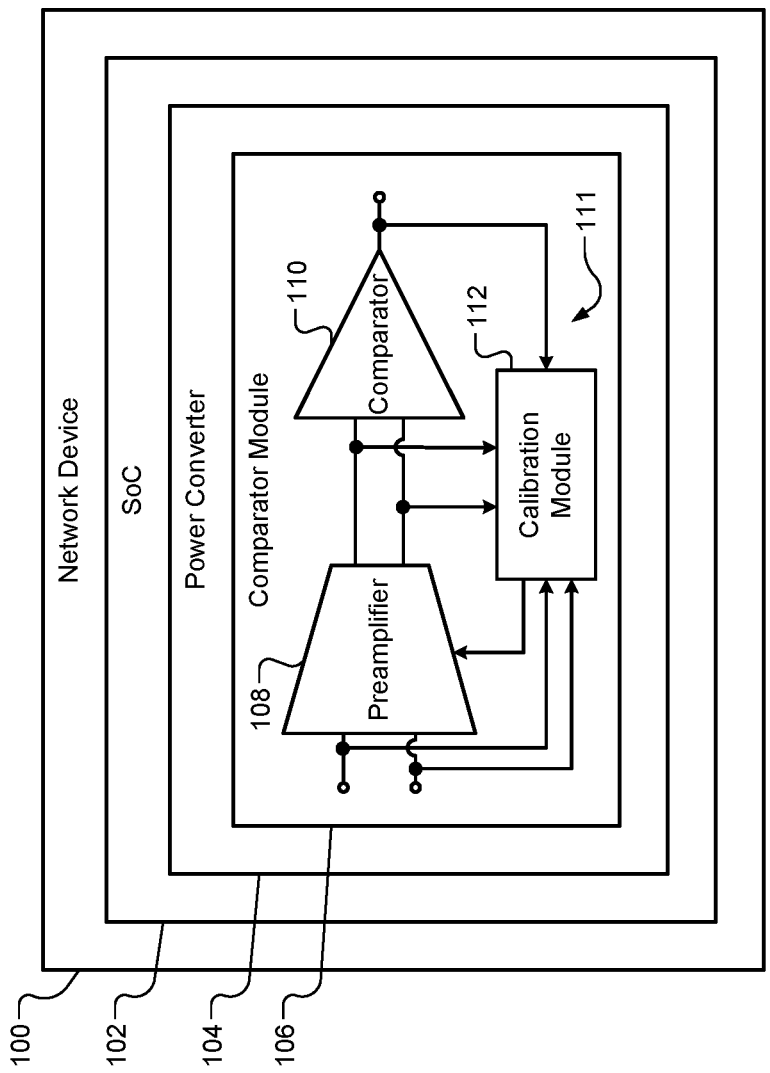
FIG. 1 is a functional block diagram of an example of a network device incorporating a power converter with a comparator module in accordance with an embodiment of the present disclosure.

Many semiconductor components, such as a power converter, need a high-speed and high-precision comparator module. The high-speed and high-precision comparator module may include a preamplifier followed by a comparator. The preamplifier amplifies input signals prior to being received by the comparator. This amplification decreases time for the comparator to detect and respond to changes in the input signals and allows for accurate detection of the input signals due to pre-amplification. As a result, high-speed/high-accuracy comparisons are conducted by this comparator module.

A high-speed comparator receives a high-bias current, which is selected for an application of the corresponding semiconductor component. An output of the high-speed comparator can be accurate by (i) including input devices, such as p-channel metal-oxide-semiconductor field-effect transistor (MOSFET) transistors, in the preamplifier that are capable of receiving high-bias current levels, and (ii) calibrating one or more resistances of the preamplifier to compensate for voltage offsets associated with the preamplifier and the comparator.

In certain applications, a high-speed comparator may be operated in different modes, such as a high-bias current mode or a low-bias current mode. As an example, the high-bias current mode may be a pulse width modulation (PWM) mode that requires high-speed comparisons with a high-bias current. The low-bias current mode may be a pulse frequency modulation (PFM) mode that requires a low-bias current and a highly accurate comparator. The low-bias current mode may be used during a low power mode (e.g., a sleep mode) of a network device. The accuracy of this comparator while operating in the low-power mode is high in order to satisfy certain system level accuracy specifications.

The examples set forth below include comparator modules that are capable of operating in any number of modes. The comparator modules allow for high-speed operation while providing highly accurate outputs. The operating modes have respective bias currents and resistance settings for minimal voltage offsets to provide highly accurate comparator outputs.

Although each of the comparator modules operates in multiple modes, each of the comparator modules may be calibrated once. A calibration code is determined during the single calibration and while operating in one of the modes (e.g., a first mode). One or more other modes use the same calibration code determined for the first mode. Although the calibration code is determined while operating in and for calibration of the first mode, the other modes use the same calibration code without re-doing the calibration again. By generating a single calibration code and using the single calibration code for multiple modes rather than determining multiple calibration codes respectively for the modes, total calibration time for the modes is decreased.

Also, as disclosed below a same calibration module, calibration feedback loop, and corresponding devices may be used for calibrating the modes of a comparator module. By sharing the same calibration module, calibration feedback loop and devices, semiconductor area associated with calibration for multi-mode comparators is minimized. Semiconductor area is minimized because a minimal number of devices and processing power is needed to calibrate the modes of the comparator module. Also since the calibration is performed once for first mode and is not repeated for the other modes, the calibration processing time is reduced while the comparator experiences high-accuracy based on the first calibration while the comparator operates in the other modes.

FIG. 1 shows a network device 100 that may include a system-on-chip (SoC) 102. The network device 100 may be a cellular phone, a computer, a laptop computer, a tablet, a wearable device, an appliance, a router, an access point, and/or other network device. The SoC may include and/or be implemented as a processor. The SoC 102 includes, for example, a power converter 104 and/or other high-speed semiconductor components that include converter modules as disclosed herein. Other examples of the semiconductor components are analog-to-digital converters and digital-to-analog converters. As shown, the power converter 104 includes a comparator module 106. The comparator module 106 includes a preamplifier 108, a comparator 110 and a calibration feedback loop 111. The calibration feedback loop 111 includes a calibration module 112.

The preamplifier 108 receives and amplifies input signals. The amplified input signals are provided to the comparator 110, which compares the amplified input signals to generate an output signal. In one embodiment, the output signal is HIGH (e.g., a digital '1' or equivalent voltage) if $V_{OA}$ is greater than $V_{OB}$ and is LOW (e.g., a digital '0' or equivalent voltage) if $V_{OA}$ is less than $V_{OB}$. In another embodiment, the output signal is '1' or '−1'.

The calibration module 112 performs a calibration process to calibrate operating modes of the comparator module 106. The calibration module 112 provides the two input signals $V_{INP}$, $V_{INN}$ of the pre-amplifier 108 with a same predetermined voltage. The calibration module 112 then receives and monitors the amplified signals $V_{OA}$, $V_{OB}$ of the pre-amplifier 108 and a voltage of the output control signal $V_{CTRL}$ from the comparator. One voltage offset calibration code may be determined based on the output control signal $V_{CTRL}$. In one embodiment, values of a calibration code are determined for a first mode based on the voltage offsets. The values of the calibration code include a bias (or quiescent) current and one or more resistance values for the preamplifier 108. One or more resistance values for one or more other modes are determined based on the calibration code. The calibration process is further described below.

Figure 2:
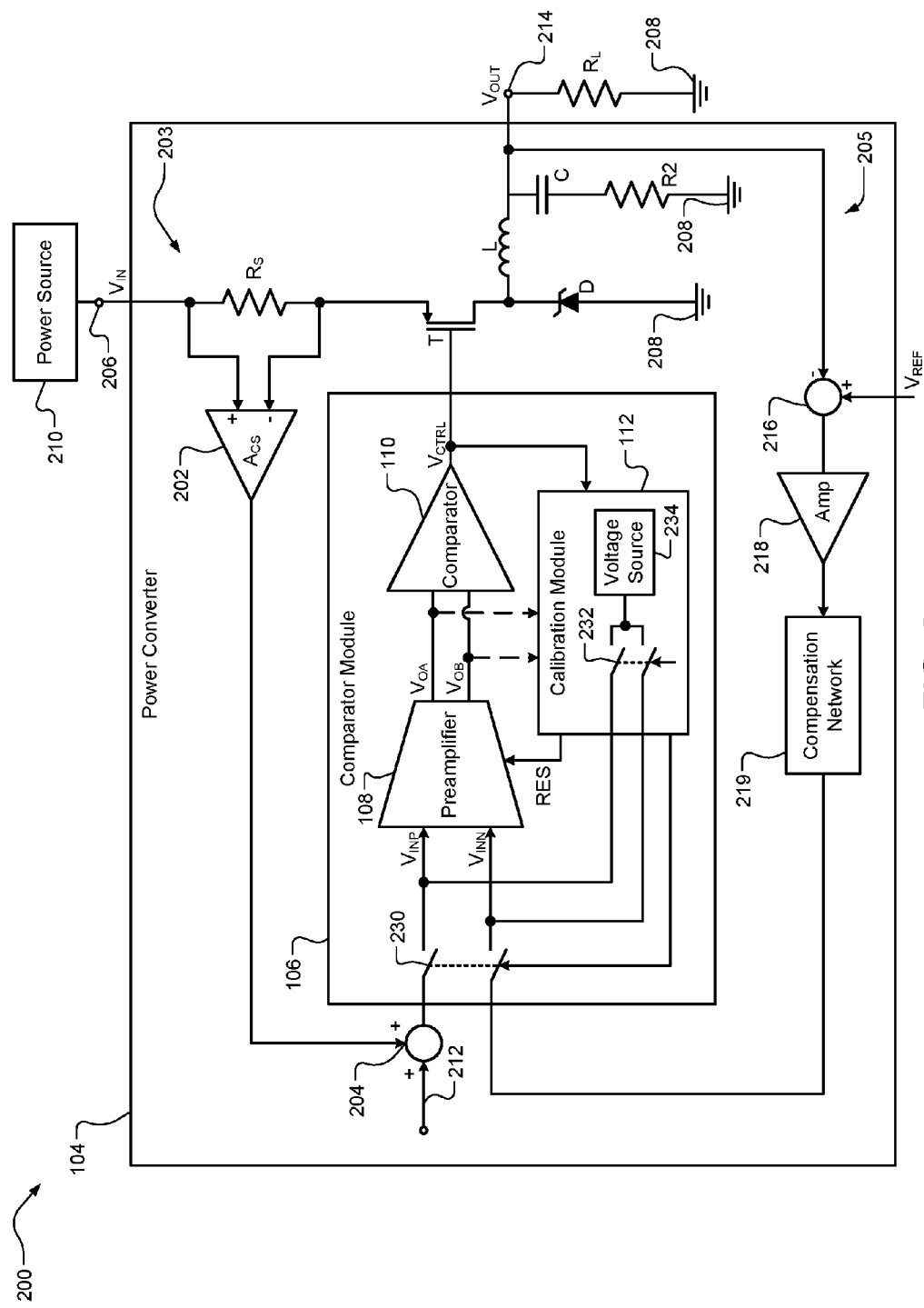
FIG. 2 is a functional block diagram of an example of the power converter of FIG. 1.

FIG. 2 shows an example of the power converter 104 that includes the comparator module 106. As shown, the power converter 104 operates as a current mode control buck converter that outputs a regulated current. The comparator module 106 includes the preamplifier 108, the comparator 110, and the calibration module 112. The power converter 104 further includes a source sensing circuit 203, a first summer 204, a transistor T, an inductor L, a capacitor C, a second resistor R2, and a feedback circuit 205. The source sensing circuit 203 includes a source resistor $R_S$ and a current-sense amplifier $A_{CS}$.

The source resistor $R_S$ is connected in series with the transistor T and the diode D between a voltage input terminal 206 and a ground terminal (or reference terminal) 208. The source resistor $R_S$, the transistor T and the diode D perform as a voltage divider. The voltage input terminal 206 receives an input voltage $V_{IN}$, which may be from a power source 210. The power source 210 may be a power supply, such as a battery or utility power source, or other power source of the network device 10 of FIG. 1. The input voltage $V_{IN}$ is a DC voltage. The control signal $V_{CTRL}$ may be a PWM signal or a PFM signal depending on the operating mode. The SoC 102 of FIG. 1 may control generation of the input voltage $V_{IN}$.

The current-sense amplifier $A_{CS}$ detects and amplifies a voltage across the source resistor $R_S$. The voltage across the source resistor $R_S$ is representative of an amount of current passing through the inductor L. An output of the current-sense amplifier $A_{CS}$ is provided to the first summer 204 and is summed with a corrective ramp signal 212 provided to the first summer 204. The corrective ramp signal 212 is provided to prevent sub-harmonic oscillation for duty cycles of the input voltage $V_{IN}$ of larger than 50% therefore slope compensation of current passing through the inductor L is performed for duty cycles greater than 50%. The output of the summer 204 is a first input voltage $V_{INP}$ to the preamplifier 108.

The transistor T is connected in series between the source resistor $R_S$ and the diode D. An output of the transistor T is provided to the inductor L. The diode D may be a Zener diode as shown and is connected between the output of the transistor T and the ground terminal 208. The inductor L is connected at a first end to the transistor T and the diode D and at a second end to the capacitor C and an output terminal 214. The capacitor is connected in series with the second resistance R2 between (i) the inductor L and the output terminal 214, and (ii) the ground terminal 208. The output terminal 214 may be connected to a load resistance $R_L$, which in turn may be connected to the ground terminal 208. The power converter 104 converts the input $V_{IN}$ to the output voltage $V_{OUT}$. As an example, the input voltage $V_{IN}$ may be 5V and the output voltage $V_{OUT}$ may be 1.2V. The gain of the power converter 104 is not affected by varying $V_{IN}$, but rather changes with variation of load resistance $R_L$. The output voltage $V_{OUT}$ can be regulated due to feedback loop 205 and remains stable with regard to changes of the input voltage $V_{IN}$, and load current.

The feedback circuit 205 includes a second summer 216 and a second amplifier 218. The second summer 216 receives a reference voltage $V_{REF}$ and subtracts the output voltage $V_{OUT}$ from the reference voltage $V_{REF}$ to generate an error signal. The second amplifier 218 amplifies and/or integrates an output of the second summer 216 (i.e. the error signal), which is provided to a compensation network 219 to generate a second input voltage $V_{INN}$. The second input voltage $V_{INN}$ is generated based on the error signal and is provided to the preamplifier 108. The second amplifier 218 determines an error between the reference voltage $V_{REF}$, which is a target voltage, and the output voltage $V_{OUT}$. The comparator module 106 operates to control the transistor T to adjust the output voltage $V_{OUT}$ to match the reference voltage $V_{REF}$.

The preamplifier 108 amplifies the input voltages $V_{INP}$, $V_{INN}$ to generate the amplified voltages $V_{OA}$, $V_{OB}$, which are provides as input voltages to the comparator 110. The comparator 110 generates a control signal $V_{CTRL}$ based on the voltages $V_{OA}$, $V_{OB}$. The comparator 110 is a high-speed comparator as it receives amplified input voltages from the preamplifier 108, which allows for fast detection of the input voltages and quick response time to generate the control signal $V_{CTRL}$. The comparator 110 determines whether $V_{OA}$ is greater than $V_{OB}$ and based on this determination generates the control signal $V_{CTRL}$.

Figure 3:
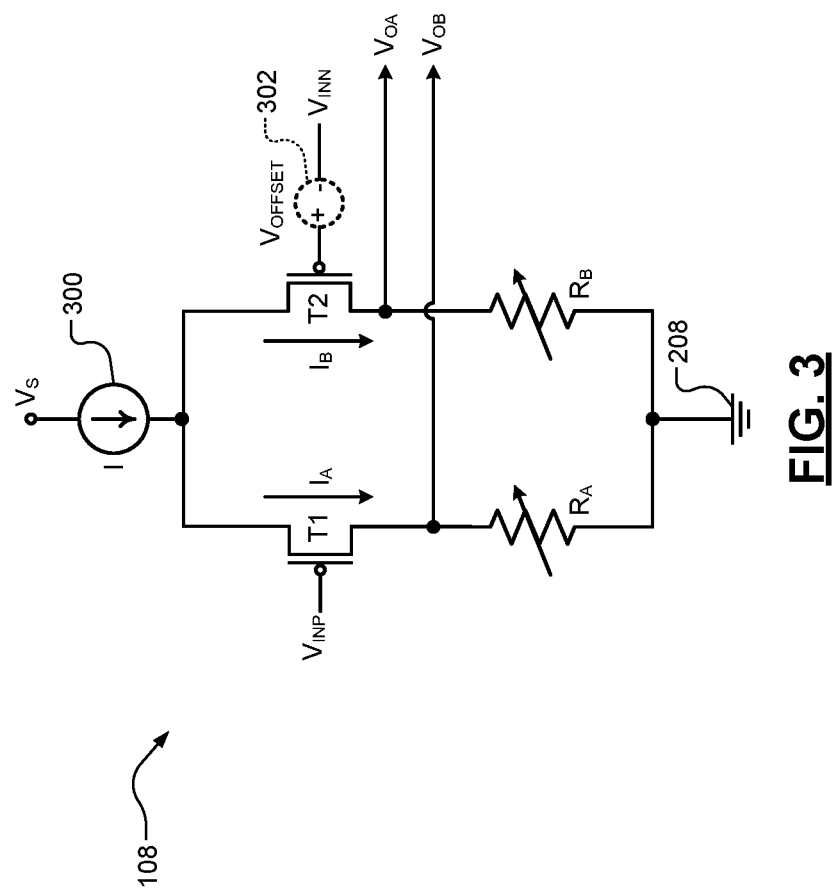
FIG. 3 is a functional block diagram of an example of a preamplifier of the comparator module of FIG. 1.

The comparator module 106 has many offset sources including: 1) mismatch of the two transistors T1 and T2; 2) mismatch of the resistors $R_A$ and $R_B$ shown in FIG. 3; and 3) an offset of the comparator 110. The offset is calibrated during a calibration mode, such that the comparator module 106 maintains high-precision during a normal operation mode.

A total offset (also referred to as the "input referred offset"), which is the offset seen at the input of the preamplifier 108, may be determined based on equation 1, where $V_{OS\_TOT}$ is a total offset experienced by the preamplifier 108 and the comparator 110, $V_{OSPREAMP}$ is the offset experienced by the preamplifier 108, $V_{OS\_COMP}$ is an offset experienced by the comparator 110, and $g_{Pre-amp}$ is a gain of the pre-amplifier 108. $V_{OSPREAMP}$ is the offset seen at the inputs of the preamplifier 108 and contributed by the preamplifier 108. $V_{OS\_COMP}$ divided by $g_{Pre-amp}$ is the offset seen at the inputs of the preamplifier 108 and contributed by the comparator 110.

$$V_{OS\_TOT} = V_{OSPREAMP} + \frac{V_{OS\_COMP}}{g_{Pre-amp}} \tag{1}$$

During the calibration phase, the calibration module 112 provides the two input signals of the pre-amplifier ($V_{INP}$ and $V_{INN}$) a same pre-determined voltage and monitors comparator output signal $V_{CTRL}$ and the amplified signals (or voltages) $V_{OA}$, $V_{OB}$. In one embodiment and as a first offset calibration example, the calibration module 112 monitors the control signal $V_{CTRL}$ and not the voltages $V_{OA}$, $V_{OB}$. The calibration module 112 generates a digital resistance adjustment code RES based on the monitored voltages and offsets, which are determined based on the monitored voltages. The digital adjustment code RES sets and/or adjusts values (e.g., $R_A$, $R_B$) of resistors of the preamplifier 108. As an example, an offset calibration value may be determined based on the control signal $V_{CTRL}$ and then changes may be made in the first digital resistance adjustment code RES to calibrate the offset calibration value. The calibration module 112 adjusts the digital resistance adjustment code RES within a small step period until $V_{CTRL}$ toggles state of the transistor T from previous state. The digital resistance adjustment code RES is then selected as a final code. This way the total offset $V_{OS\_TOT}$ is calibrated.

As another example, a second offset calibration may be performed based on a difference between the voltages $V_{OA}$, $V_{OB}$. The calibration module 106 adjusts the digital resistance adjustment code RES during a small step period until $V_{OA}$ is equal to $V_{OB}$. Then the digital resistance adjustment code RES is selected as the final code. This way only the pre-amplifier offset $V_{OSPREAMP}$ is calibrated. The first offset calibration provides a higher offset coverage than the second offset calibration.

FIG. 3 shows an example of the preamplifier 108, which includes a bias current source 300, transistors T1, T2, and variable resistors $R_A$, $R_B$. In an embodiment, the transistors are p-channel MOSFET (PMOS) transistors. In other embodiment, the transistors can be NMOS transistors or combinations of NMOS and PMOS transistors. The bias current source 300 receives a supply voltage Vs. The amount of bias current I output from the bias current source 300 is adjusted based on the mode of operation. Each of the transistors T1, T2 is connected in series between the bias current source 300 and a respective one of the variable resistors $R_A$, $R_B$. The transistors T1, T2 include control terminals that receive respectively the voltages $V_{INP}$, $V_{INN}$.

The variable resistors $R_A$, $R_B$ are connected at a first end to the transistors and at a second end to the ground terminal 208.

The comparator module 106 further includes switches 230 and the calibration module 112 includes switches 232 and a power source 234. The power source 234 provides a predetermined voltage to the inputs of the preamplifier 108 when the switches 230 are open and the switches 232 are closed, which occurs during the calibration mode. The switches 230, 232 may be implemented as transistors. The calibration module 112 controls operation of the switches 230, 232 and or selection of the predetermined voltage generated by the power source 234.

Due to variances in the transistors T1, T2 and the variable resistors $R_A$, $R_B$, a first offset may exist between the voltages $V_{INP}$, $V_{INN}$. A second offset may exist between the voltages $V_{OA}$, $V_{OB}$ due to the first offset and variability between components in the comparator 110 (or second stage). The second offset is not as dominate as the first offset in general, since the second offset is attenuated by the gain of the preamplifier 108 (first stage). The first offset is represented by the ±voltage source $V_{OFFSET}$, which is connected to the control terminal of transistor T2, such that when $V_{INP}$ and $V_{INN}$ are connected to receive the same predetermined voltage during the calibration mode, the $V_{OFFSET}$ is the intrinsic offset from the pre-amplifier 108. A transconductance gain $g_m$ of the preamplifier 108 changes with change in (i) the bias current I provided by the bias current source 300, and (ii) resistances of the variable resistors $R_A$, $R_B$. The transconductance $g_m$ for the preamplifier 108 may be represented by equation 2, where $\Delta I = I_A - I_B$, $I_A$ is an amount of current passing through transistor T1, and $I_B$ is an amount of current passing through transistor T2 during the calibration mode with $V_{INP}$ and $V_{INN}$ connected together to receive the predetermined voltage.

$$\Delta I = g_m \cdot V_{OFFSET} \quad (2)$$

Since $I_A$ and $I_B$ are different, $R_A$ and $R_B$ should be different in order for $V_{OA}$ to be equal to $V_{OB}$. Equation 3 provides a relationship between the bias current I and the resistances $R_A$, $R_B$. Equation 3 can be deducted from a product of $I_A$ and $R_A$ being equal to a product of $I_B$ and $R_B$, such that $V_{OA}$ is equal to $V_{OB}$ after calibration.

$$\frac{\Delta I}{I} = \frac{R_B - R_A}{R_A} \quad (3)$$

Referring to FIGS. 2-3, the calibration module 112 operates to adjust one or more of the variable resistors $R_A$, $R_B$ to minimize the effect from first offset and the second offset to minimize the total offset. This adjustment is based on one or more of $V_{CTRL}$, $V_{OA}$, $V_{OB}$, $V_{INP}$, $V_{INN}$ and/or one or more of the determined offsets.

Figure 4:
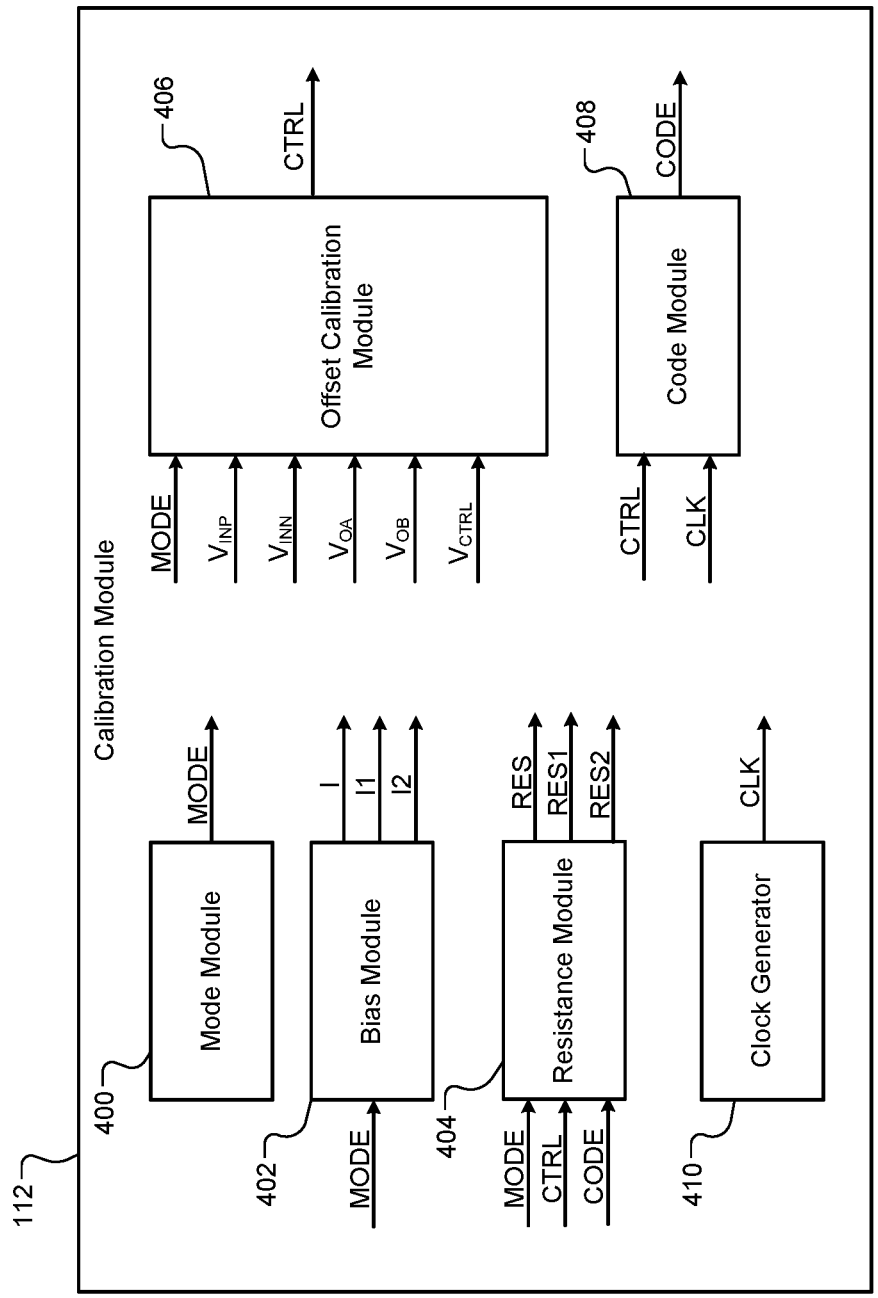
FIG. 4 is a functional block diagram of an example of a calibration module of the comparator module of FIG. 1.

FIG. 4 shows an example of the calibration module 112, which includes a mode module 400, a bias module 402 generating bias currents for modes, a resistance module 404 generating resistor pair values for modes, an offset calibration module 406, a code module 408, and a clock generator 410. Operation of the modules 112, 400, 402, 404, 406 and the clock generator 410 is described below with respect to the calibration method of FIG. 5. For further defined structure of the modules of FIGS. 1-4 see below provided calibration method of FIG. 5 and below provided definition for the term "module".

Figure 5:
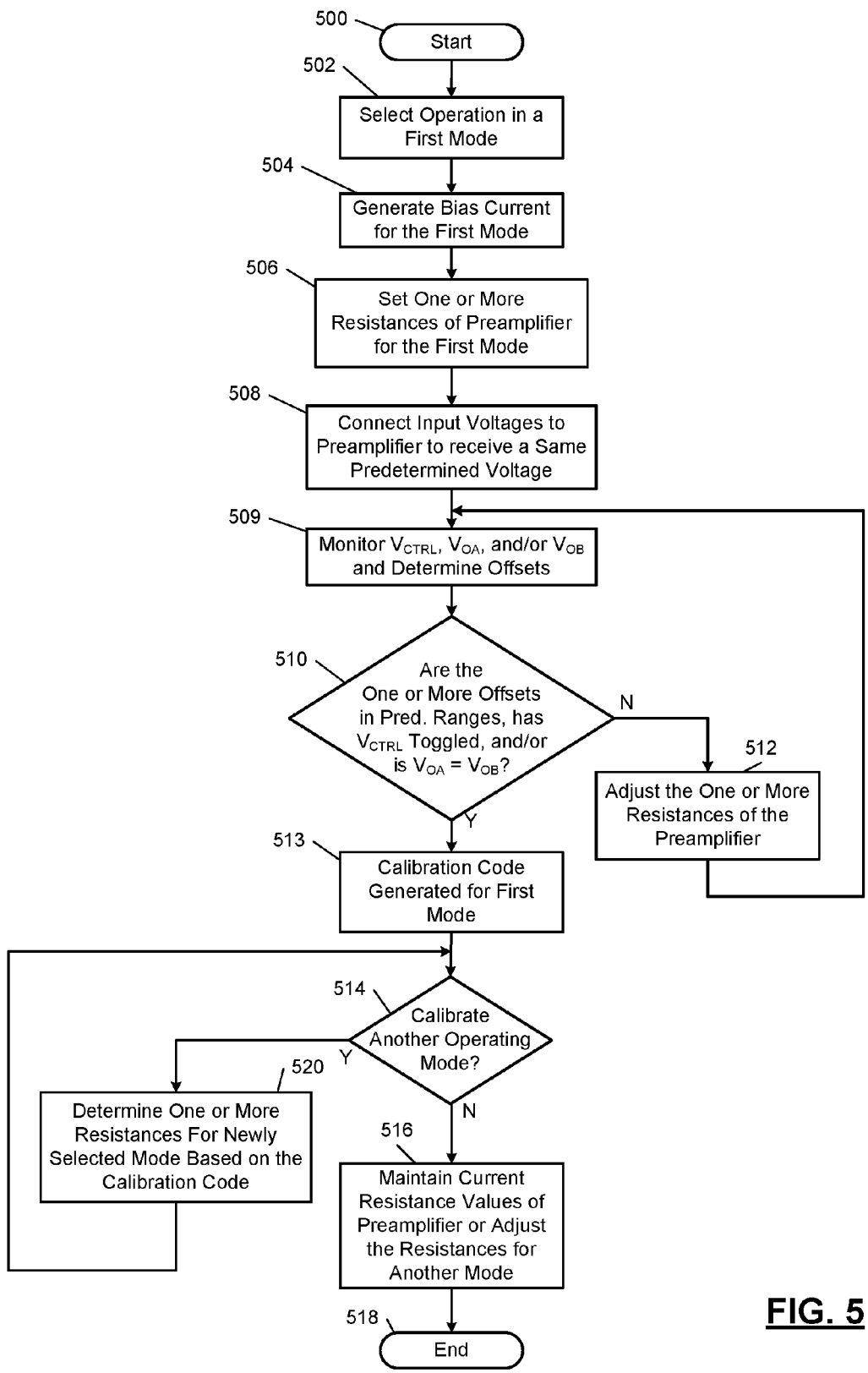
FIG. 5 illustrates a calibration method in accordance with an embodiment of the present disclosure.

The systems disclosed herein may be operated using numerous methods, an example method is illustrated in FIG. 5. Although the following tasks of FIG. 5 are primarily described with respect to the implementations of FIGS. 1-4, the tasks may be easily modified to apply to other implementations of the present disclosure. The tasks may be iteratively performed.

The method may begin at 500. At 501, the calibration module 112 selects operation in the calibration mode. At 502, the mode module 400 selects a first mode to calibrate and initiates operation in the first mode. This includes generating an indication signal MODE to indicate the operating mode selected. In one embodiment, the first mode is a high-bias current mode and/or a PWM mode. The high-bias current mode has a higher bias current provided by the bias current source 300 than bias current provided during a low-current mode. As an example, the high-bias current mode may include the bias current source 300 providing a bias current that is 10 times or more higher than the bias current provided by the bias current source 300 during the low-current mode. As another example, the bias current is 50 micro amperes (μA) during the high-bias current mode and 5 μA during the low-current mode. In one embodiment, the high-bias current mode is calibrated subsequent to calibration of the low-bias current mode. As an alternative, the low-bias current mode may be calibrated subsequent to the high-bias current mode.

At 504, the bias module 402, based on the indication signal MODE, controls operation of the bias current source 300 to generate a bias current I associated with the first mode. This may include generating a high-bias current if operating in the high-bias current mode. The bias current I is low if operating in low-bias current mode and high if operating in the high-bias current mode.

At 506, the resistance module 404, based on the indication signal MODE, sets resistances of one or more of the variable resistors $R_A$, $R_B$ to initial values for the first mode. The resistance values may be set based on a default code. In one embodiment, a resistance of one of the resistors $R_A$, $R_B$ is set at an initial value and is maintained at the initial value throughout calibration of the first mode, whereas resistance of the second resistor may be adjusted during the calibration of the first mode. The goal of the second resistor $R_{1B}$ (resistor $R_B$ for the first mode) change is to minimize the input referred offset from the comparator module 106. After calibration is done, one resistance set ($R_{1A}$, $R_{1B}$) is generated for the first mode to maintain low input referred offset. If the total input referred offsets for different bias current modes are slightly different, calibrations could be performed for other bias current modes to aid in providing high-precision. However, this would increase circuit and/or processor requirements and require more computing time to achieve. Instead, the disclosed method may only calibrate the offset for one mode (e.g., the first mode), and perform calculations to automatically generate appropriate resistance value sets ($R_A$, $R_B$ value sets) for one or more other modes. The disclosed hardware and method minimizes hardware and computing time requirements while maintaining low-input referred offset for all corresponding modes.

At 508, the offset module 406, based on the indication signal MODE, connects $V_{INP}$ and $V_{INN}$ (or inputs of the preamplifier 108 together and to a power source, such the inputs receive a same predetermined voltage during the calibration mode. This causes $V_{INP}$ to be equal to $V_{INN}$. The inputs of the preamplifier 108 are later separated during the normal operation mode.

At 509, the calibration module 112 monitors one or more of the voltages $V_{CTRL}$, $V_{OA}$, $V_{OB}$, and determines one or more of the offsets. The control signal $V_{CTRL}$ is monitored until the transistor T is toggled from a current state to a next state. A main offset $V_{OS}$ comes from mismatch from T1 and T2, which is represented by equation 4, where σ is a device specific coefficient and/or constant value, W is a width of T1 or T2, and L is the width of T1 or T2. The offset of the preamplifier 108 is a function of and/or is based substantially on the main offset $V_{OS}$. The width and length of T1 may be equal to respectively the width and length of T2. The main offset $V_{OS}$ may remain the same. If the main offset $V_{OS}$ is small, then the size (width and/or length) of T1 and T2 is large. If the main offset $V_{OS}$ is large, then the size of T1 and/or T2 is small. Other smaller offset sources are associated with the resistance mismatch and the offset of the comparator 110.

$$V_{OS} = \frac{\sigma}{\sqrt{W \cdot L}} \quad (4)$$

At 510, the offset module 406 determines whether the input referred offset for the module (i.e. $V_{OS\_TOT}$) is within a corresponding predetermined range of a minimum offset value. This may include determining whether $V_{CTRL}$ has toggled and/or whether $V_{OA}$ is equal to $V_{OB}$. If the $V_{CTRL}$ changes state from a previous state (e.g., from 1 to 0, or from 0 to 1) with small change of $R_B$ and/or if $V_{OA}$ is equal to $V_{OB}$, then the calibration is done for determining the resistance set (i.e. $R_A$ and $R_B$ values) for the first mode. The resistance set for the first mode is represented as RES1 in FIG. 4. Other resistance sets for the other modes may be determined below at 520 and have corresponding designators RES2, RES3 . . . . A second resistance set for the second mode is represented as RES2 in FIG. 4. If the $V_{CTRL}$ remains the same with a new $R_B$, then $R_B$ needs to be adjusted for a next value (i.e. task 512 is performed). Whether the $R_B$ value should be adjusted higher or lower depends on the $V_{CTRL}$. If $V_{CTRL}$ is a "1", the $R_B$ value is decreased. If $V_{CTRL}$ is a "0", then the $R_B$ value is increased. The adjustment continues until $V_{CTRL}$ changes state from a previous state.

In one embodiment, tasks 508 and 510 are performed such that the offsets are also determined for one or more other modes. At 510, if the input referred offsets are not within predetermined ranges for the one or more other modes, task 512 is performed, otherwise task 513 is performed. Once task 513 is finished, the calibration for first mode is done and the calibration code has been determined.

At 512, the offset module 406 may generate the control signal CTRL to adjust the resistances of the resistors $R_B$ to reduce the offsets. The resistance module 404 generates the digital resistance adjustment signal RES based on the control signal CTRL. In one embodiment, the offset module 406 adjusts $R_B$ in a certain direction to change state (e.g., digital state) based on polarity of the control signal $V_{CTRL}$. For example, to determine whether the resistances $R_A$, $R_B$ are set, such that $V_{OFFSET}$ is minimized or within a predetermined range of a minimum offset value (e.g., 0), the resistance $R_B$ is adjusted until the state and/or polarity of the control signal $V_{CTRL}$ changes. When the state and/or polarity of the control signal $V_{CTRL}$ changes, this is an indication that the resistances $R_A$, $R_B$ are set such that $V_{OFFSET}$ is minimized or within a predetermined range of a minimum offset value (e.g., 0). Task 509 is performed subsequent to task 512.

When the calibration module 112 has finished iteratively performing tasks 509, 510 and 512, calibration of the first mode is completed. At 513, the code module 408 generates a calibration code and may generate a calibration code signal CODE indicating the calibration code based on the control signal CTRL and a clock signal CLK generated by the clock generator 410. The calibration code may include resistances of the resistors $R_A$, $R_B$ set during calibration of the first mode and/or other information as described above. The resistances may be the final resistances of the resistors $R_A$, $R_B$ at the end of calibrating the first mode. The calibration code may further include the bias current and the gain of the preamplifier for the first mode that existed at the end of calibrating the first mode. The resistances for the first mode may be represented as $R_{1A}$, $R_{1B}$. The bias current I for the first mode is represented as I1 and the gain of the preamplifier 108 for the first mode is represented as $g_{m1}$. FIG. 4 also shows a second bias current $I_2$ for the second mode. The bias module 402 may generate respective bias currents for each of the modes. The calibration code may further include the voltage offset $V_{OFFSET}$ that existed at the end of calibrating the first mode. Relationship between the resistances, the bias current and the gain for the first mode may be represented by equations 5-6.

$$R_{1B} - R_{1A} = \frac{g_{m1} V_{OFFSET}}{I_1} \cdot R_{1A} \quad (5)$$

$$V_{OFFSET} = \frac{I_1(R_{1B} - R_{1A})}{g_{m1} R_{1A}} \quad (6)$$

The calibration code may be stored in memory and used for calibrating one or more other modes.

At 514, the mode module 400 determines whether another mode is to be calibrated. The comparator module 106 may be operated in any number of modes. If no other mode is to be calibrated, task 516 may be performed, otherwise task 520 is performed. At 516, the calibration module 112 exits the calibration mode, connects $V_{INP}$, $V_{INN}$ back to summer 204 and compensation network 219, and returns to normal operation mode. This may include the resistance module 404 maintaining states of the resistors $R_A$, $R_B$ at the resistances calibrated for the first mode as shown or may adjust the resistances for another operating mode. The bias current I may also be adjusted, via for example the bias module 402, for the selected operating mode. The method may end at 518.

At 520, the resistance module 404 determines one or more resistances for the resistors $R_A$, $R_B$ for the newly selected mode based on the calibration code determined at 513, the bias current for the newly selected mode, and/or a predetermined fixed resistance of one of the resistors $R_A$, $R_B$. Calibration of the newly selected mode does not include monitoring one or more of the voltages $V_{CTRL}$, $V_{OA}$, $V_{OB}$ to determine the offsets. Instead, the resistance module 404 calculates the resistances based on the previously determined calibration code. As an example, the resistance of the resistor $R_A$ may be a predetermined fixed resistance for the newly selected mode. The resistance of the resistor $R_B$ may be calculated using known values provided in the calibration code.

In one embodiment, the resistance of the resistor $R_A$ may be a predetermined fixed resistance for the newly selected mode. The resistance of the resistor $R_B$ may be calculated using, for example, equations 7-13 and is represented as $R_{nB}$, where n refers to the $n^{th}$ mode.

$$\Delta I_n = I_{nA} - I_{nB} \tag{7}$$

$$\Delta I_n = g_{mn} \cdot V_{OFFSET} \tag{8}$$

$$\frac{\Delta I_n}{I_n} = \frac{R_{nA} - R_{nB}}{R_{nA}} \tag{9}$$

$$V_{OFFSET} = \frac{I_n(R_{nA} - R_{nB})}{g_{mn} R_{nA}} = \frac{I_1(R_{1A} - R_{1B})}{g_{m1} R_{1A}} \tag{10}$$

$$\Delta R_n = R_{nA} - R_{nB} = \frac{g_{mn} V_{OFFSET}}{I_n} \cdot R_{nA} \tag{11}$$

$$\Delta R_n = \frac{g_{mn}}{g_{m1}} \cdot \frac{I_1}{I_n} \cdot \frac{R_{nA}}{R_{1A}} \cdot \Delta R_1 \tag{12}$$

$$R_{nB} = R_{nA} - \frac{g_{mn}}{g_{m1}} \cdot \frac{I_1}{I_n} \cdot \frac{R_{nA}}{R_{1A}} \cdot \Delta R_1 \tag{13}$$

As can be seen by the above equations 7-13, a linear relationship exists between the operating modes, which allows for determining resistances for one of the modes based on resistances calibrated for another one of the modes. For this reason, the calibration code determined for the first mode can be used to determine resistance values for the other modes.

By using the calibration code, determined for the first mode, for the nth mode together with corresponding bias currant and resistance values, the total input referred offsets are kept small similar to that of the first mode. The total offset for the comparator module 106 may be represented by equation 14 for the $n^{th}$ mode. Based on equation 14, assuming the $g_{COMPn}$ and $g_{COMP1}$ are relatively big (>10) and assuming the offset in the first mode is fully calibrated out, the input referred offsets for the nth first mode is small, which results in the comparator 110 maintaining high-precision operation. For example, if $g_{COMPn}$ is equal to $g_{COMP1}$ then the offset of the comparator 110 may be near or equal to zero.

$$V_{OS\_TOTn} = V_{OS\_COMPn} \left( \frac{1}{g_{COMPn}} - \frac{1}{g_{COMP1}} \right) \tag{14}$$

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

The above-described examples provide a comparator module including a preamplifier, a comparator and a calibration module that operate in multiple modes and provide high-precision output control for each mode. Resistance values of variable resistors of the preamplifier are able to be precisely set for each of the modes based on a calibration code determined for first one of the modes. As a result, calibration of the other modes is simplified and performed quickly.

The above-described method may be applied to a high-speed comparator module, such as that disclosed above for a DC-to-DC power converter having two operating modes (a PWM mode and a PFM mode). The above-described method provides a comparator module that provides high-speed comparisons while operating in the PWM mode and implementing a high-bias current. The comparator module also provides high precision comparisons while operating in the PFM mode and implementing a low-bias current.

The above-described method further allows for a calibration code to be determined for a first mode and used to determine parameters including resistances for any number of other operating modes. Since calibration loop(s) for monitoring voltages of a comparator module may only be utilized for the first mode, the number of calibration loops may be minimized. This minimization reduces the number of calibration loops used to monitor voltages for offset determinations of the different modes. Reducing the number of calibration loops, results in a reduction in hardware, chip area associated with calibration, and/or corresponding die size. Also, with less parameters being monitored and evaluated, calibration processing time and processor requirements to calibrate the modes are reduced.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

In this application, apparatus elements described as having particular attributes or performing particular operations are specifically configured to have those particular attributes and perform those particular operations. Specifically, a description of an element to perform an action means that the element is configured to perform the action. The configuration of an element may include programming of the element, such as by encoding instructions on a non-transitory, tangible computer-readable medium associated with the element.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A calibration circuit comprising:
a mode module to select operation in a first mode or a second mode;
a bias module to generate (i) a first bias current for a preamplifier of a comparator while in the first mode, and (ii) a second bias current for the preamplifier while in the second mode;
a calibration module to, during calibration of the first mode, (i) connect inputs of the preamplifier together to receive a predetermined voltage;
an offset module to (i) determine an offset based on (a) output voltages of the preamplifier, or (b) an output voltage of the comparator, and (ii) generate a control signal based on whether the offset is within a first predetermined range;
a resistance module to, based on the control signal and during calibration of the first mode, adjust a first resistance of a resistor in a resistance set of the preamplifier for the first mode; and
a code module to generate a calibration code based on the first resistance,
wherein the resistance module is to, subsequent to calibrating the first mode, calculate a second resistance set for second mode based on the calibration code determined during the calibration of the first mode.

2. The calibration circuit of claim 1, wherein:
the offset module is to:
generate the control signal to adjust the first resistance, monitor the output voltage of the comparator while the first resistance is being adjusted, and
when a digital state or a polarity of the output voltage changes, generate the control signal to cease adjustment of the first resistance;
the first resistance is a calibrated resistance for the first mode when the digital state or polarity of the output voltage changes; and
the code module is to generate the calibration code to include the calibrated resistance.

3. The calibration circuit of claim 1, wherein:
the offset is a first offset; and
the offset module is to:
monitor two or more of (i) the output voltages of the preamplifier, and (ii) the output voltage of the comparator;
determine a plurality of offsets based respectively on (i) the output voltages of the preamplifier, and (ii) the output voltages of the comparator, wherein the plurality of offsets include the first offset; and generate the control signal based on the plurality of offsets.

4. The calibration circuit of claim 1, wherein:
the code module is to generate the calibration code to include for the first mode the first resistance, the first bias current and a first gain of the preamplifier; and
the resistance module is to calibrate the first mode based on (i) the first resistance, (ii) the first bias current, and (iii) the first gain of the preamplifier for the first mode.

5. The calibration circuit of claim 4, wherein:
the resistance module is to calculate the second resistance set based on (i) the second bias current, (ii) a second gain of the preamplifier for the second mode; and (iii) the first resistance set, and
the resistance module is to determine a second resistance of the resistor based on the calibration code.

6. The calibration circuit of claim 1, wherein the offset module is to:
determine a total offset of the calibration circuit for the first mode based on (i) an offset for the preamplifier, and (ii) an offset for the comparator; and
based on the total offset, generate the control signal to adjust the first resistance.

7. The calibration circuit of claim 6, wherein the code module is to generate the calibration code if the total offset is within a second predetermined range.

8. The calibration circuit of claim 6, wherein:
the offset module is to
determine a total offset of the calibration circuit for the first mode; and
based on the total offset determined for the first mode, generate the control signal to adjust the first resistance; and
the code module is to generate the calibration code if the total offset is within a predetermined range.

9. A comparator module comprising:
the calibration circuit of claim 1;
the preamplifier comprising (i) two input differential pair transistors, and (ii) two resistors connected in series respectively with the two input differential pair transistors; and
the comparator.

10. A power converter comprising:
the comparator module of claim 9;
a power stage comprising a power transistor, a diode, an inductor, and an output capacitor;
an output voltage sense circuit to receive an output voltage from the output capacitor;
an error amplifier to (i) receive the output voltage, and (ii) generate a first input voltage for the comparator module; and
a sensing circuit to (i) detect an amount of current passing through the inductor, and (ii) based on the amount of current passing through the inductor, generate a second input voltage for the comparator module,
wherein the comparator is to (i) compare the first input voltage to the second input voltage, and (ii) based on the comparison, control a state of the transistor to adjust the amount of current passing through the inductor.

11. A calibration circuit comprising:
a mode module to select operation in a first mode or a second mode;
a bias module to generate (i) a first bias current for a preamplifier of a comparator while in the first mode, and (ii) a second bias current for the preamplifier while in the second mode;
an offset module to, during calibration of the first mode, monitor an output voltage of the comparator, and (ii) generate a control signal based on the output voltage;
a resistance module to, based on the control signal and during calibration of the first mode, adjust a first resistance of a resistor of the preamplifier for the first mode; and
a code module to generate a calibration code based on the first resistance,
wherein the resistance module is to, subsequent to calibrating the first mode, calibrate the second mode based on the calibration code in the first mode.

12. The calibration circuit of claim 11, wherein:
the offset module is to:
generate the control signal to adjust the first resistance, monitor the output voltage of the comparator while the first resistance is being adjusted, and
when a digital state or a polarity of the output voltage changes, generate the control signal to cease adjustment of the first resistance;
the first resistance is a calibrated resistance for the first mode when the digital state or polarity of the output voltage changes; and
the code module is to generate the calibration code to include the calibrated resistance.

13. The calibration circuit of claim 11, wherein:
the code module is to generate the calibration code to include for the first mode the first resistance, the first bias current and a first gain of the preamplifier;
the resistance module is to calibrate the second mode based on the first resistance,
the first bias current,
the first gain of the preamplifier for the first mode,
the second bias current, and
a second gain of the preamplifier for the second mode; and the resistance module is to, while calibrating the second mode, determine a second resistance of the resistor based on the calibration code.

14. The calibration circuit of claim 11, wherein the offset module is to:
determine a total offset of the calibration circuit for the first mode based on (i) an offset for the preamplifier, and (ii) an offset for the comparator; and
based on the total offset, generate the control signal to adjust the first resistance.

15. A method of calibrating a comparator circuit comprising:
selecting operation in a first mode or a second mode;
generating (i) a first bias current for a preamplifier of a comparator while in the first mode, and (ii) a second bias current for the preamplifier while in the second mode;
during calibration of the first mode, (i) connecting inputs of the preamplifier together to receive a predetermined voltage, (ii) determining an input referred offset of the preamplifier based on (a) output voltages of the preamplifier, and (b) an output voltage of the comparator, and (iii) generating a control signal based on whether the offset is within a first predetermined range;
based on the control signal and during calibration of the first mode, adjusting a first resistance of a resistor in a resistance set of the preamplifier for the first mode;
generating a calibration code based on the first resistance; and
subsequent to calibrating the first mode, calculating a second resistance set for second mode based on the calibration code determined during the calibration of the first mode.

16. The method of claim 15, further comprising:
generating the control signal to adjust the first resistance;
monitoring the output voltage of the comparator while the first resistance is being adjusted;
when a digital state or a polarity of the output voltage changes, generating the control signal to cease adjustment of the first resistance,
wherein the first resistance is a calibrated resistance for the first mode when the digital state or polarity of the output voltage changes; and
generating the calibration code to include the calibrated resistance.

17. The method of claim 15, further comprising:
generating the calibration code to include for the first mode the first resistance, the first bias current and a first gain of the preamplifier;
calculating the second resistance set based on
the first resistance,
the first bias current,
the first gain of the preamplifier for the first mode,
the second bias current, and
a second gain of the preamplifier for the second mode; and
while calculating the second resistance set, determining a second resistance of the resistor.

18. The method of claim 15, further comprising, while calculating the second resistance set, refraining from monitoring the (a) the output voltages of the preamplifier, and (b) the output voltage of the comparator.

19. The method of claim 15, further comprising:
determining, for the first mode, a total offset of the preamplifier and the comparator based on (i) an offset for the preamplifier, and (ii) an offset for the comparator; and
based on the total offset, generating the control signal to adjust the first resistance.

20. The method of claim 15, further comprising:
determining, for the first mode, a total offset of the preamplifier and the comparator based on (i) an offset for the preamplifier, and (ii) an offset for the comparator;
based on the total offset, generating the control signal to adjust the first resistance; and
generating the calibration code if the total offset is within a second predetermined range.

* * * * *